United States Patent [19]

Blackburn

[11] 4,205,275
[45] May 27, 1980

[54] METHOD AND APPARATUS OF CONTROLLING BIAS VOLTAGE IN REGULATING AMPLIFIERS

[75] Inventor: Tom L. Blackburn, San Jose, Calif.

[73] Assignee: GTE Automatic Electric Laboratories, Incorporated, Northlake, Ill.

[21] Appl. No.: 965,973

[22] Filed: Dec. 4, 1978

[51] Int. Cl.² .............................................. H03G 3/30
[52] U.S. Cl. .................................... 330/279; 330/254; 330/284
[58] Field of Search ............... 330/129, 139, 145, 254, 330/279, 284

[56] References Cited

U.S. PATENT DOCUMENTS 3,962,650  6/1976  Gay ....................................... 330/254

*Primary Examiner*—James B. Mullins
*Attorney, Agent, or Firm*—Russell A. Cannon

[57] ABSTRACT

A regulating amplifier circuit with each transistor of a differentially connected pair thereof having a base electrode connected through an associated varistor to a first control transistor, the series combination of each varistor and the control transistor being driven by a variable DC bias voltage. The first control transistor is responsive to a gain control voltage for varying its conduction rate through the varistors and thus the gain of the circuit. A first resistor, the primary conduction path of a second control transistor, and a second resistor are electrically connected in series between a fixed DC supply voltage and a ground reference potential, with the second transistors collector voltage being coupled through an emitter follower as the bias voltage. Negative feedback of the first control transistors collector voltage to the second control transistors base electrode causes the magnitude of the bias voltage to vary for maintaining the first control transistor operating out of the saturation region over an extended range of input signal levels.

17 Claims, 2 Drawing Figures

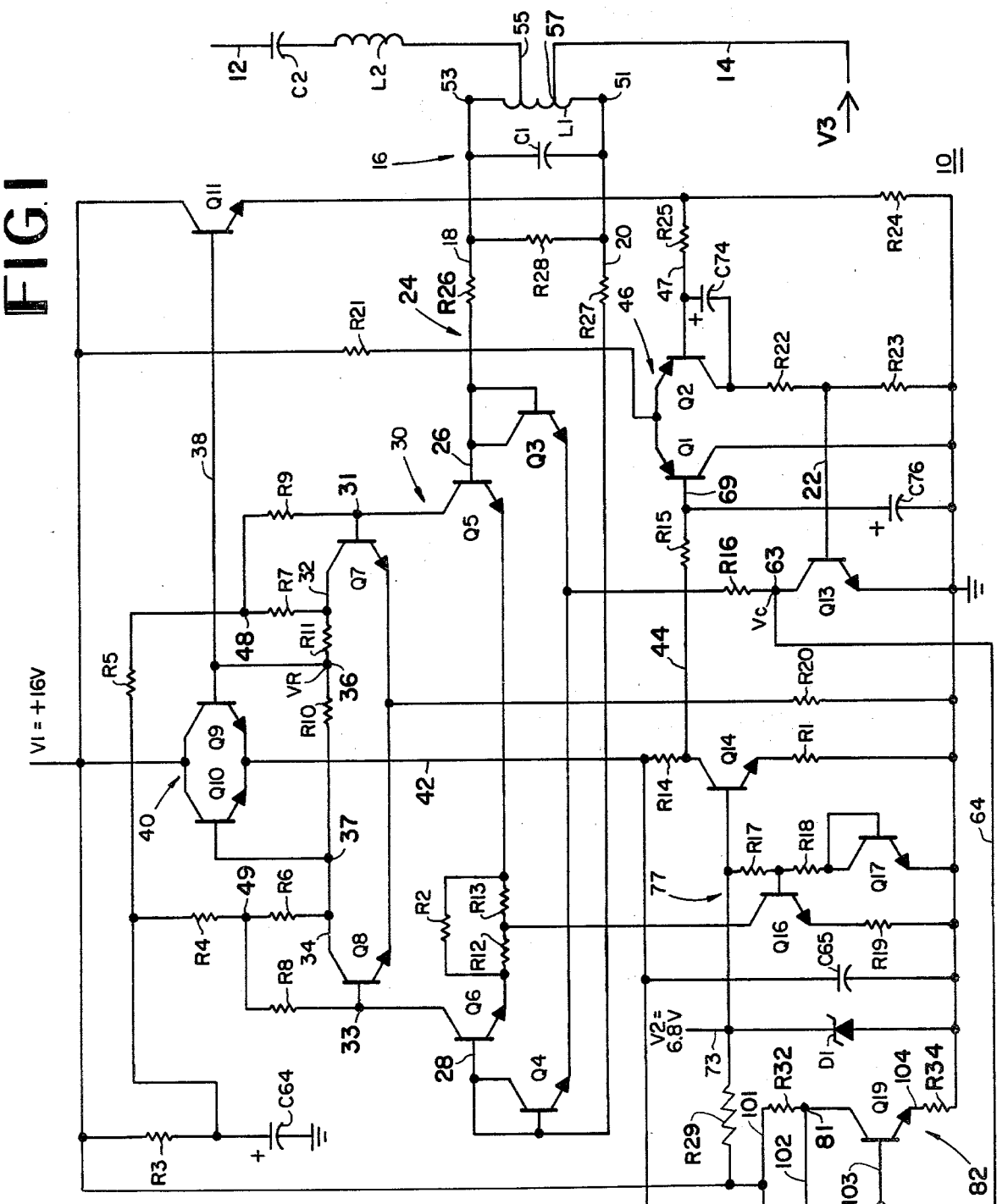
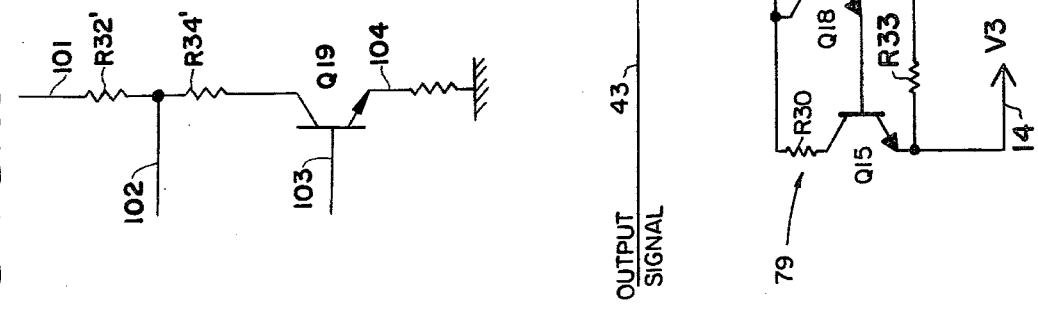

METHOD AND APPARATUS OF CONTROLLING BIAS VOLTAGE IN REGULATING AMPLIFIERS

BACKGROUND OF INVENTION

This invention relates to regulating amplifiers and more particularly to improved method and apparatus for broadening the range of input signal levels over which a regulating amplifier provides the desired regulation.

Regulating amplifier circuits are generally described in U.S. Pat. No. 4,145,665 of O. G. Wisotzky and T. L. Blackburn, issued Mar. 20, 1979, Ser. No. 881,464, filed Feb. 27, 1978, and U.S. Pat. No. 3,962,650 of M. J. Gay, issued June 8, 1976. A regulating amplifier circuit generally comprises a control circuit having a fixed resistor, a varistor, and a control transistor electron control means electrically connected in series between a fixed DC bias voltage and a ground reference potential, the junction of the resistor and varistor being connected to an input terminal of a transistor amplifier electron control means. The control transistor is responsive to a control voltage for adjusting the level of current passed by the varistor for changing its resistance and thus the gain of the regulating amplifier for maintaining the level of an output signal relatively constant. As the level of an AC input signal voltage increases, current passed by the control transistor is increased to maintain the AC signal at the input terminal of the transistor amplifier relatively constant for providing the desired regulation. The gain of the regulating amplifier is initially adjusted to provide a minimum control current for low level AC input signals. The maximum level of AC input signals for which the desired regulation is obtained occurs when the voltage across the fixed resistor results in saturation of the control transistor. This problem is identified at column 6, lines 2-5, of the Gay patent. In order to prevent this saturation condition, the DC bias voltage could be raised to allow a higher control current and correspondingly higher input signal levels. It is necessary, however, that the maximum DC bias voltage be maintained less than that for which clipping occurs in the output signal. This limits the maximum input signal level for which the overall circuit operates to provide the desired regulation.

SUMMARY OF INVENTION

An object of this invention is the provision of an improved regulating amplifier.

Another object is the provision of an improved regulating amplifier having a variable control-circuit bias voltage for increasing the range of input signal levels over which the desired regulation is maintained.

Another object is the provision of a method of increasing the range of input signal levels over which a regulating amplifier operates to provide a desired regulation.

In accordance with this invention, the magnitude of the DC bias voltage driving a control circuit, which includes an element that is susceptible to operation in a saturation region, in a regulating amplifier is varied for maintaining the control circuit element operating out of the saturation region in order to increase the range of input signal levels over which the overall circuit operates to provide the desired regulation. In a regulating amplifier with a control circuit comprising a varistor and a first transistor electrically connected in series between a bias voltage and a reference potential, a first resistor, the primary conduction path of a second transistor, and a second resistor are electrically connected in series between a fixed DC supply voltage and a reference potential, with the second transistor collector voltage being coupled through emitter follower means as the bias voltage for the control circuit. Negative feedback means couples the first transistor collector voltage to the second transistor base for increasing its collector voltage, and thus the bias voltage, for maintaining the first transistor operating out of the saturation region over an extended range of input signal levels.

DESCRIPTION OF DRAWING

FIG. 1 is a schematic circuit diagram of a regulating amplifier embodying this invention; and FIG. 2 is a circuit diagram illustrating an alternate embodiment of this invention.

DESCRIPTION OF PREFERRED EMBODIMENTS

Refereing now to FIG. 1, the regulating amplifier 10 is essentially the same as the one in U.S. Pat. No. 4,145,665 of O. G. Wisotzky and T. L. Blackburn, issued Mar. 20, 1976, Ser. No. 881,464, filed Feb. 27, 1978, which is incorporated herein by reference, except for the circuit 79 which is responsive to the collector voltage from the control transistor Q13 for providing a variable DC bias voltage V3 on line 14 for driving the gain control circuit 24 including R25 and R27, variolosser elements Q3 and Q4, current limiting resistor R16, and the gain control transistor Q13. The structure and operation of a prior art regulating amplifier that does not include the circuit 79 are described in detail in the aforementioned patent of T. L. Blackburn and will be only briefly described here.

The regulating amplifier 10 generally comprises a differential input circuit 16, a differential amplifier 30 including cascaded stages Q5-Q6 and Q7-Q8 of differential amplification, a differential detector circuit 40 for rectifying an amplified signal at node 37 and a high gain differential amplifier 46. A DC bias voltage in line 14 establishes a DC voltage on lines 26 and 28 and thus the DC operating point of amplifier 30. In the receiver section of a subscriber carrier telephone system employing amplifier 10, a voice modulated carrier frequency input signal on line 12 is converted to equal amplitude AC signals on lines 18 and 20 that are 180° out-of-phase and regulated by the operation of control circuit 24 on amplifier stages Q5-Q6 and Q7-Q8. An amplified signal at node 37 is detected by Q9 and Q10 to produce a detected-output signal on lines 42, 43 and 44 which is integrated by R15 and C76. The effective value of the detected signal on line 69 is compared with a DC reference voltage $V_R$ at node 36 and on line 47 in differential amplifier elements Q1 and Q2 for producing a gain control voltage on line 22. This voltage on the Q13 base controls the level of conduction of Q13, and thus the resistances of varistor transistors Q3 and Q4, which are inversely proportional to the magnitude of current passed thereby, for adjusting the level of alternating input signals applied to lines 26 and 28.

In operation, an increase of the level of a differential input signal on lines 26 and 28 causes a corresponding increase in the level of an amplified signal at node 37, the detected signal on line 44, and the integrated signal on line 69. This causes Q1 and Q2 to raise the level of the gain control voltage on line 22 to forward bias Q13 so that it passes a higher current through the varistor elements Q3 and Q4 to reduce the resistances thereof, and thus the level of the differential input signals on lines 26 and 28. This causes a corresponding decrease in the amplified signal at node 37 in order to lower the level of the detected signal on line 43. Conversely, a decrease in the level of the alternating signal on lines 26 and 28 causes a corresponding decrease in the gain control voltage on line 22 which decreases the control current in Q3 and Q4 to increase the level of the differential signal applied to amplifier 30. In this manner, the level of the output signal from regulating amplifier 10 is maintained relatively constant. If the bias voltage V3 is maintained constant, the alternating input signal voltage may rise sufficiently to cause a gain control voltage on line 22 that drives Q13 into saturation so that the circuit will no longer provide the desired regulation as the level of the input signal increases beyond that point. Also as Q13 approaches operation in the saturation region, the DC voltage on lines 26 and 28 and the Q13 collector voltage decrease in value.

In accordance with this invention, an increase in the input signal level and the gain control voltage above a prescribed level is sensed for causing an increase in the DC bias voltage V3 on line 14 for increasing the node 63 voltage so as to hold Q13 operating out of the saturation region. More specifically, a decrease in the Q13 collector voltage, which indicates that the current in Q13 and the varistors is increasing and that Q13 is moving in the direction of saturation, is sensed for causing an increase in V3 for raising the DC signal level on lines 26 and 28 and thus the Q13 collector voltage for holding Q13 out of saturation over an extended range of input signal levels.

It is seen from the drawing that the bias voltage V3 is provided by the circuit 79 comprising a DC voltage transistor 82 including a pair of resistors R32 and R34 and a transistor Q19; and a Darlington compound including a pair of transistors Q15 and Q18. The resistor R32, the Q19 collector-emitter path, and R34 are electrically connected in series between a DC supply voltage V1 and ground. The Q19 collector voltage is electrically connected through the base-emitter junction diodes of Q18 and Q15 to line 14 for providing the DC bias voltage V3 there for the varistor elements Q3 and Q4 and the control element Q13 of the gain control circuit. The transistors Q15 and Q18 operate as a high impedance source which isolates the Q19 collector from elements of the gain control circuit. In accordance with this invention, the Q13 collector voltage is directly electrically connected on line 64 to the Q19 base electrode for controlling the conduction rate of Q19, and thus its collector voltage which sets the bias voltage V3. The Q19 base electrode is also electrically connected through a 110 Kohm resistor R33 to the Q15 emitter electrode for providing a base drive current to Q19 when Q13 is conducting only lightly. In order to obtain maximum regulation from the circuit 10, it is desirable that the DC bias voltage be as low as possible for a specified minimum input signal level. Since this minimum value of V3 is limited by the voltage drops across the Q13 collector-emitter path and the Q3 base-emitter diode, V3$_{min}$ may be nominally 1.25 volts. The maximum value of DC bias voltage V3 is spaced two diode junction drops (Q15 and Q18) plus the voltage drop across R32 below the supply voltage V1. The resistances R32 and R34 are selected to bias Q19 to have a minimum value of collector voltage that is approximately two base-emitter junction diode voltage drops (Q15 and Q18) above the desired minimum bias voltage V3$_{min}$.

As the level of the AC input signal on line 12 increases, the Q13 collector current may increase sufficiently to move it toward operation in the saturation region such that the DC voltage level on the Q13 collector begins to drop. This voltage change at node 53 causes an increase in the Q19 collector voltage. This change in voltage at node 81 is coupled through Q18 and Q15 to line 14 for increasing the bias voltage V3, which in turn increases the DC voltage on lines 26 and 28 and the Q13 collector voltage to a level that prevents Q13 operating in the saturation region. This feedback action through Q19 and Q18 will continue for AC input signals of increasing value until the bias voltage V3 reaches a maximum value that is approximately two base-emitter junction diode voltage drops below the supply voltage V1 for preventing Q13 saturating over a range of input signals which is greater than that of a regulating amplifier in which the value of the bias voltage V3 is fixed.

In an embodiment of this invention in which the resistances of R32 and R34 were 42.2 K and 21.5 Kohms for providing a bias voltage V3$_{min}$ of 6.2 volts which was required for other circuitry, a regulating amplifier circuit 10 had a maximum operating range of input signal levels of approximately 72 dB as opposed to an allowable range of input signal levels of only 65 dB for a regulating amplifier 10 in which the value of the bias voltage V3 was fixed. Since the resistance of R32 is substantially twice that of R34, the absolute magnitude of the change in the bias voltage V3 is substantially twice that of the change in the Q13 collector voltage. A resistance ratio of 2 was chosen in the regulating amplifier to keep the loop gain low for preventing oscillation and rendering it relatively insensitive to DC transients. This resistance ratio may have different values depending on the magnitude of the supply voltage V1 and the circuit configuration.

This operation of the circuit 79 for extending the range of input signal levels over which the amplifier 10 operates for providing a desired regulation can be verified analytically. The loop voltage in circuit 79 is representable as:

$$V1 = 2V_{be} + V_{R32} + V3 \tag{1}$$

where $2V_{be}$ here represents the sum of the Q18 and Q15 base-emitter function diode voltage drops, and the voltage across R32 is $$V_{R32} = 2I'R34 = 2(V_c - V_{be}) \tag{2}$$

where $R32 = 2 R34$, $I'$ is the Q19 collector current, $V_c$ is the Q13 collector voltage, and $V_{be}$ here is the Q19 base-emitter junction diode voltage drop. Substituting equation (2) in equation (1) reveals that $$V3 = V1 - 2V_c \tag{3}$$

The loop voltage in the control circuit 24 is representable as $$V3 = R26I/2 + V_{be3} + IR16 + V_c \tag{4}$$

where IR16 is approximately 0 since R16 << R26, I is the current passed by Q13, and $V_{be3}$ is the base-emitter junction diode voltage drop of Q3 which is approximately 0.55 volt for $I_c=2\mu A$ and approximately 0.7 volt for $I_c=3.5$ mA. Thus, equating equations (3) and (4) when the Q13 collector current $I_c$ is small reveals that $$V3=V1-2V_c=0+0.55+0-V_c \qquad (5)$$

so that $V_c=5.15$ volts and $V3=5.7$ volts for a supply voltage $V1=16$ volts. Conversely, when the Q13 collector current is relatively large, equating equations (3) and (4) reveals that $$V3=V1-2V_c=5.13+0.7+0+V_c \qquad (6)$$

so that $V_c=3.26$ volts and $V3=9.49$ volts for $I=3.5$ mA, $V1=16$ volts and $R26=3.16$ K ohms. This shows that the bias voltage V3 increases as the Q13 collector voltage decreases. Considering that the bias voltage V3 rises to a maximum of 14.6 volts (approximately two diode voltage drops below a supply voltage $V1=16$ volts) and recognizing that the Q13 collector voltage $V_c$ is approximately one-half the difference between the supply voltage V1 and the bias voltage V3, then the Q13 collector $V_c$ decreases to approximately 0.7 volt for a bias voltage of 14.6 volts. Since Q13 is not yet saturated for the highest current to be passed by Q13, it is seen that an amplifier 10 embodying this invention can provide the desired regulation over a broader range of input signals than such a circuit 10 with a fixed bias voltage driving the control circuit 24.

Although this invention is described in relation to preferred embondiments thereof, variations and modifications will occur to those skilled in the art without parting from the spirit of this invention. By way of example, the differential amplifier circuit 30 may employ more than two cascaded stages of differential amplification or be only a single stage of differential amplifier. Alternatively, the amplifier circuit may be an unbalanced amplifier with only a single active element Q5. Also, a balanced output signal may be coupled from the Q7 or Q8 collector lines 32 and 34, the nodes 48 and 49, or the nodes 31 and 33 at the collectors of Q5 or Q6. Alternatively, an unbalanced output voltage may be coupled between one of these points and ground. Further, the control voltages on line 22 may be produced by circuitry other than the detector 40 and differential amplifier circuit 46. Additionally, the gain control element Q13 may be an FET or other type of variable current source. Also, the variolosser elements Q3 and Q4 may be diodes. Additionally, the positions of the input resistors R26 and R27 and associated varistor elements Q3 and Q4 may be reversed and the sense of the gain control voltage on line 22 reversed for providing the desired regulation. Further, R34 and R32 may be electrically connected in series between the Q19 collector and the Q18 collector, with the node 81 being the junction therebetween, as is illustrated in FIG. 2. The scope of this invention is therefore to be determined from the attached claims rather than from the detailed description of preferred embodiments thereof.

What is claimed is:

1. In a regulating amplifier circuit including electron control means driven by a bias voltage and responsive to a gain control signal for regulating the circuit gain, the control means being susceptible to operation in a saturation region that limits the range of input signal levels over which it provides the regulating amplifier circuit with the desired regulation, the method of extending the range of input signal level over which the desired regulation is maintained comprising the step of varying the bias voltage so as to maintain the electron control means operating out of the saturation region over a broader range of input signal levels.

2. The method according to claim 1 wherein the step of varying the bias voltage comprises the step of increasing the bias voltage to hold the electron control means operating out of the saturation region over a range of input signal levels.

3. The method according to claim 1 wherein the step of varying the bias voltage comprises the steps of sensing an increase in the gain control signal and increasing the bias voltage as the gain control signal increases.

4. The method according to claim 1 wherein the step of varying the bias voltage comprises the steps of sensing an increase in the input signal level and increasing the bias voltage as the input signal level increases.

5. The method according to claim 1 wherein the electron control means has a terminal with a voltage which decreases as the electron control means approaches operation in the saturation region, the step of varying the bias voltage including the steps of: sensing the terminal voltage on the electron control means, and increasing the bias voltage as the terminal voltage decreases for maintaining the control means operating out of the saturation region over a range of input signals.

6. In a regulating amplifier circuit including electron control means driven by a bias voltage and being susceptible, as the level of current passed thereby increases in response to a control signal for regulating the circuit gain, to operation in a saturation region that limits the range of input signal levels over which it operates to provide the desired regulation, the method of extending the range of input signal level over which the desired regulation is maintained comprising the step of increasing the bias voltage as the current passed by the control means increases to hold the latter operating out of the saturation region over a range of input signal levels.

7. In a regulating amplifier circuit including in combination first electron control means having first and second terminals and operable for varying the level of an input signal coupled to the first terminal and for producing an output signal at the second terminal, and second electron control means having a third terminal electrically connected through a variable impedance element to the first terminal and to a bias voltage, the second electron control means being susceptible to operation in a saturation region for limiting the maximum value of current passed thereby as it is responsive to a gain control signal for varying the magnitude of current it passes through the impedance element for varying its impedance and the circuit gain for producing a regulated output signal at the second terminal, the method of extending the range of input signal levels over which the amplifier circuit operates to provide the desired regulation comprising the step of varying the bias voltage so as to maintain the second electron control means operating out of the saturation region over a range of input signal levels.

8. The method according to claim 7 wherein the step of varying the bias voltage comprises the step of increasing the bias voltage as the current passed by the second control means increases for maintaining the second electron control means operating out of saturation over a range of input signal levels.

9. The method according to claim 7 wherein the voltage on the third terminal decreases as current passed by the second control means increases and it approaches operation in the saturation region, the step of varying the bias voltage including the steps of: sensing a decrease in the third terminal voltage, and increasing the bias voltage as the third terminal voltage decreases for maintaining the second electron control means operating out of saturation over a range of input signal levels.

10. In a regulating amplifier circuit including in combination first electron control means having first and second terminals and operable for varying the level of an input signal coupled to the first terminal and for producing an output signal at the second terminal, and second electron control means having a third terminal electrically connected through a variable impedance element to the first terminal and to a bias voltage, the second electron control means being susceptible to operation in a saturation region for limiting the maximum value of current passed thereby as it is responsive to a gain control signal for varying the magnitude of current it passes through the impedance element for varying its impedance and the circuit gain for producing a regulated output signal at the second terminal, the improvement comprising:

first means providing an indication of movement of the second control means in the direction of operation in the saturation region; and second means responsive to the indication from said first means for increasing the bias voltage for extending the range of input signals over which the circuit operates to provide the desired regulation.

11. The improvement according to claim 10 wherein said first means provides an indication which is proportional to the voltage on the third terminal which decreases as the current in the second control means increases and the second control means approaches operation in the saturation region which limits the maximum current passed thereby.

12. The improvement according to claim 11 wherein said second means comprises; a first transistor having an emitter and collector and having a base that is responsive to the indication of the third terminal voltage; a first resistor; third means electrically connecting the first transistor emitter to a reference potential and the first transistor collector through said first resistor to a supply voltage; and fourth means for electrically coupling a voltage which is a bias voltage from the one side of said first resistor that is spaced from the supply voltage, whereby a decrease in the third terminal voltage causes an increase in the bias voltage.

13. The improvement according to claim 12 wherein said second means further comprises a second resistor in the electrical connection of said first transistor collector to said first resistor, said fourth means coupling a voltage from the junction of said first and second resistors.

14. The improvement according to claim 12 wherein said second means further comprises a second resistor in the electrical connection of said first transistor emitter to a reference potential, said fourth means coupling the bias voltage from said first transistor collector.

15. The improvement according to claim 13 or 14 wherein said fourth means comprises a second transistor having a base electrically connected to the one side of said first resistor, having a collector electrically connected to the supply voltage, and having an emitter from which the bias voltage is coupled.

16. The improvement according to claim 15 wherein said second means further comprises a third resistor electrically connected between said second transistor emitter and said first transistor base.

17. The improvement according to claim 16 wherein the ratio of the resistance of said first and second resistors determines the magnitude of the change in the bias voltage for a given change in the third terminal voltage.

* * * * *

UNITED STATES PATENT AND TRADEMARK OFFICE
CERTIFICATE OF CORRECTION

PATENT NO. : 4,205,275
DATED : May 27, 1980
INVENTOR(S) : Tom L. Blackburn

It is certified that error appears in the above-identified patent and that said Letters Patent are hereby corrected as shown below:

Column 2, line 24, "Mar. 20, 1976" should read --Mar. 20, 1979--.

Column 3, line 37, "transistor" should read --translator--, and same column, line 55, "110 Kohm" should read --110K ohm--.

Column 4, line 8, "53" should read --63--; same column, line 24, "21.5 Kohms" should read --21.5K ohms--; and same column, line 50, "function" should read --junction--.

Column 8, line 4, ";" should read --:--, and same column, line 36, "resistance" should read --resistances--.

Signed and Sealed this

Fourth Day of November 1980

[SEAL]

Attest:

SIDNEY A. DIAMOND

Attesting Officer

Commissioner of Patents and Trademarks